US012757617B2

(12) United States Patent
Kim et al.

(10) Patent No.: US 12,757,617 B2
(45) Date of Patent: Oct. 6, 2026

(54) DISPLAY DEVICE

(71) Applicant: Samsung Display Co., Ltd., Yongin-Si (KR)

(72) Inventors: Myunghwan Kim, Yongin-si (KR); Sangyeol Kim, Hwaseong-si (KR); Kwanhee Lee, Suwon-si (KR); Minju Kim, Suwon-si (KR); Munhwa Song, Hwaseong-si (KR); Dong-Myung Shin, Hwaseong-si (KR); Younghoon Lee, Masan-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 790 days.

(21) Appl. No.: 17/726,177

(22) Filed: Apr. 21, 2022

(65) Prior Publication Data

US 2022/0344623 A1 Oct. 27, 2022

(30) Foreign Application Priority Data

Apr. 23, 2021 (KR) ........................ 10-2021-0053290

(51) Int. Cl.
*H10K 59/80* (2023.01)
*G02B 1/14* (2015.01)
(Continued)

(52) U.S. Cl.
CPC ............. *H10K 59/875* (2023.02); *G02B 1/14* (2015.01); *G02B 1/16* (2015.01); *G02B 5/20* (2013.01); *H10K 59/879* (2023.02); *H10K 59/38* (2023.02); *H10K 59/8792* (2023.02); *H10K 2102/00* (2023.02); *H10K 2102/311* (2023.02); *H10K 2102/351* (2023.02)

(58) Field of Classification Search
CPC ............. H10K 59/38; H10K 2012/311; H10K 2102/00; G02B 1/14; G02B 1/16; G02B 5/20
USPC .......................................... 428/1.1, 1.3, 1.32
See application file for complete search history.

(56) References Cited

U.S. PATENT DOCUMENTS 5,550,429 A * 8/1996 Hayama ................ H01J 29/868 313/111
8,344,396 B2 1/2013 Shim et al.
(Continued)

FOREIGN PATENT DOCUMENTS

CN 111552397 A 8/2020
CN 112313545 A 2/2021
(Continued)

*Primary Examiner* — Ruiyun Zhang
(74) *Attorney, Agent, or Firm* — F. CHAU & ASSOCIATES, LLC

(57) ABSTRACT

A display device including: a display module; a color filter layer disposed on the display module; and a window panel disposed on the color filter layer, wherein the window panel includes a glass substrate adjacent to the color filter layer, and an optical layer disposed on the glass substrate and having a reflectance of about 1.08% to about 5.00%, wherein the optical layer includes a base layer adjacent to the glass substrate, a first functional layer disposed on the base layer, wherein the first functional layer includes a hard coating agent and an anti-static agent, and a second functional layer disposed on the first functional layer, wherein the second functional layer includes a fluorine-containing silane compound.

24 Claims, 10 Drawing Sheets

(51) Int. Cl.

| | |
|---|---|
| ***G02B 1/16*** | (2015.01) |
| ***G02B 5/20*** | (2006.01) |
| *H10K 59/38* | (2023.01) |
| *H10K 102/00* | (2023.01) |

(56) References Cited

U.S. PATENT DOCUMENTS

| | | | | |
|---|---|---|---|---|
| 9,657,178 | B2 | 5/2017 | Cho et al. | |
| 10,347,700 | B2 | 7/2019 | Yang et al. | |
| 10,401,906 | B2 | 9/2019 | Choi et al. | |
| 10,892,443 | B2 | 1/2021 | Ahn et al. | |
| 11,281,258 | B2 | 3/2022 | Park et al. | |
| 11,307,339 | B2 | 4/2022 | Iwasaki et al. | |
| 2020/0257338 | A1* | 8/2020 | Park .................... | H04M 1/0268 |
| 2022/0365257 | A1 | 11/2022 | Kim et al. | |

FOREIGN PATENT DOCUMENTS

| | | | |
|---|---|---|---|
| KR | 10-0976866 | | 8/2010 |
| KR | 10-1194210 | | 10/2012 |
| KR | 10-2014-0037080 | A | 3/2014 |
| KR | 10-1523819 | | 5/2015 |
| KR | 10-1713277 | | 3/2017 |
| KR | 10-2017-0051111 | A | 5/2017 |
| KR | 10-2017-0113822 | | 10/2017 |
| KR | 10-2018-0039219 | | 4/2018 |
| KR | 10-2020-0072643 | | 6/2020 |
| KR | 10-2020-0098758 | A | 8/2020 |
| KR | 10-2021-0031415 | A | 3/2021 |

* cited by examiner

DISPLAY DEVICE

CROSS-REFERENCE TO RELATED APPLICATION

This U.S. non-provisional patent application claims priority under 35 U.S.C. § 119 to Korean Patent Application No. 10-2021-0053290, filed on Apr. 23, 2021, the disclosure of which is incorporated by reference herein in its entirety.

TECHNICAL FIELD

The present disclosure relates to a display device, and more specifically, to a display device including a window panel including an optical layer.

DISCUSSION OF RELATED ART

A display device is an output device for presentation of information in visual form. Various display devices are used in multimedia devices such as televisions, mobile phones, tablet computers, navigation systems, and game consoles. More recently, a foldable or rollable display device, which includes a flexible display member, has been developed to facilitate portability and improve a user's convenience.

Recently, research has been conducted in an effort to reduce the reflectance of light incident on a display device to the outside, to thereby increase the visibility of images.

SUMMARY

The present disclosure provides a display device in which a window panel includes an optical layer, and which has low reflectance properties.

An embodiment of the present disclosure provides a display device including: a display module; a color filter layer disposed on the display module; and a window panel disposed on the color filter layer, wherein the window panel includes a glass substrate adjacent to the color filter layer, and an optical layer disposed on the glass substrate and having a reflectance of about 1.08% to about 5.00%, wherein the optical layer includes: a base layer adjacent to the glass substrate, a first functional layer disposed on the base layer, wherein the first functional layer includes a hard coating agent and an anti-static agent, and a second functional layer disposed on the first functional layer, wherein the second functional layer includes a fluorine-containing silane compound.

The second functional layer may be a single layer, and the second functional layer may have a refractive-index of about 1.3 to about 1.5.

The second functional layer may have a thickness of about 30 nm to about 120 nm.

The second functional layer may include: a first sub-functional layer adjacent to the first functional layer, having a refractive index of about 1.3 to about 1.5, and not including the fluorine-containing silane compound; and a second sub-functional layer disposed on the first sub-functional layer, and including the fluorine-containing silane compound.

The first sub-functional layer may have a thickness of about 30 nm to about 120 nm, and the second sub-functional layer may have a thickness of about 1 nm to about 25 nm.

The first sub-functional layer may include a silicon oxide.

The second functional layer may include: a first sub-functional layer adjacent to the first functional layer, wherein the first sub-functional layer includes at least one high-refractive layer and at least one low-refractive layer, and a second sub-functional layer disposed on the first sub-functional layer, wherein the second sub-functional layer includes the fluorine-containing silane compound.

The second functional layer may include: a first sub-functional layer; and a second sub-functional layer disposed on the first sub-functional layer, wherein the second sub-functional layer includes the fluorine-containing silane compound, and the first sub-functional layer includes a first refractive layer, a second refractive layer, a third refractive layer and a fourth refractive layer, which are sequentially stacked in a direction from the first functional layer to the second sub-functional layer, and the first refractive layer and the third refractive layer each have a refractive index of about 2.0 to about 2.5, and the second refractive layer and the fourth refractive layer each have a refractive index of about 1.3 to about 1.5.

The first refractive layer and the third refractive layer may include a niobium oxide, and the second refractive layer and the fourth refractive layer may include a silicon oxide.

The first refractive layer may have a thickness of about 10 nm to about 20 nm, the second refractive layer may have a thickness of about 20 nm to about 40 nm, the third refractive layer may have a thickness of about 100 nm to 150 nm, and the fourth refractive layer may have a thickness of about 50 nm to about 150 nm.

The second sub-functional layer may have a thickness of about 1 nm to about 25 nm.

The display device may further include an impact-absorbing layer disposed between the glass substrate and the color filter layer, wherein the impact-absorbing layer includes an indium oxide.

The impact-absorbing layer may have a thickness of about 1 nm to about 10 nm.

The base layer may include a polyimide, a polyethylene terephthalate, or a polycarbonate.

The base layer may have a modulus of about 3 GPa to about 5 GPa.

The display device may further include a folding region foldable with respect to a folding axis extending in one direction, and a first non-folding region and a second non-folding region which are spaced apart from each other with the folding region disposed therebetween.

An embodiment of the present disclosure provides a display device including: a display module; a color filter layer disposed on the display module; and a window panel disposed on the color filter layer, and including an optical layer, wherein the optical layer includes: a base layer; a first functional layer disposed on the base layer, and including a hard coating agent and an anti-static agent; and a second functional layer disposed on the first functional layer, including an anti-fouling agent, and having a refractive index of about 1.3 to about 1.5.

The second functional layer may be a single layer, and the second functional layer may have a thickness of about 30 nm to about 120 nm.

The second functional layer may include: a first sub-functional layer adjacent to the first functional layer, not including the anti-fouling agent, and having a refractive index of about 1.3 to about 1.5; and a second sub-functional layer disposed on the first sub-functional layer, and including the anti-fouling agent.

The second functional layer may include: a first sub-functional layer adjacent to the first functional layer; and a second sub-functional layer disposed on the first sub-functional layer, wherein the first sub-functional layer includes: a first refractive layer having a refractive index of about 2.0 to about 2.5; a second refractive layer having a refractive index of about 1.3 to about 1.5; and a third refractive layer having a refractive index of about 2.0 to about 2.5

The optical layer may have a reflectance of about 1.08% to about 5.00%.

The display device may include a plurality of light-emitting regions spaced apart from each other, and a non light-emitting region disposed between the light-emitting regions adjacent to each other, wherein the color filter layer includes: a plurality of filter parts corresponding to the light-emitting regions; a light-shielding part disposed between the filter parts, and corresponding to the non light-emitting region; and an organic layer covering the filter parts and the light-shielding part.

An embodiment of the present disclosure provides a display device including: a display module; a color filter layer disposed on the display module; and an optical layer disposed on the color filter layer and having a reflectance of about 1.08% to about 5.00%, wherein the optical layer includes: a first functional layer including a hard coating agent and an anti-static agent, and a second functional layer disposed on the first functional layer, wherein the second functional layer includes a fluorine-containing silane compound.

The second functional layer may form an uppermost portion of the optical layer.

The second functional layer may have a refractive-index of about 1.3 to about 1.5

BRIEF DESCRIPTION OF THE FIGURES

The above and other features of the present disclosure will become readily apparent by reference to the following detailed description when considered in conjunction with the accompanying drawings wherein.

DETAILED DESCRIPTION OF THE EMBODIMENTS

Figure 1:
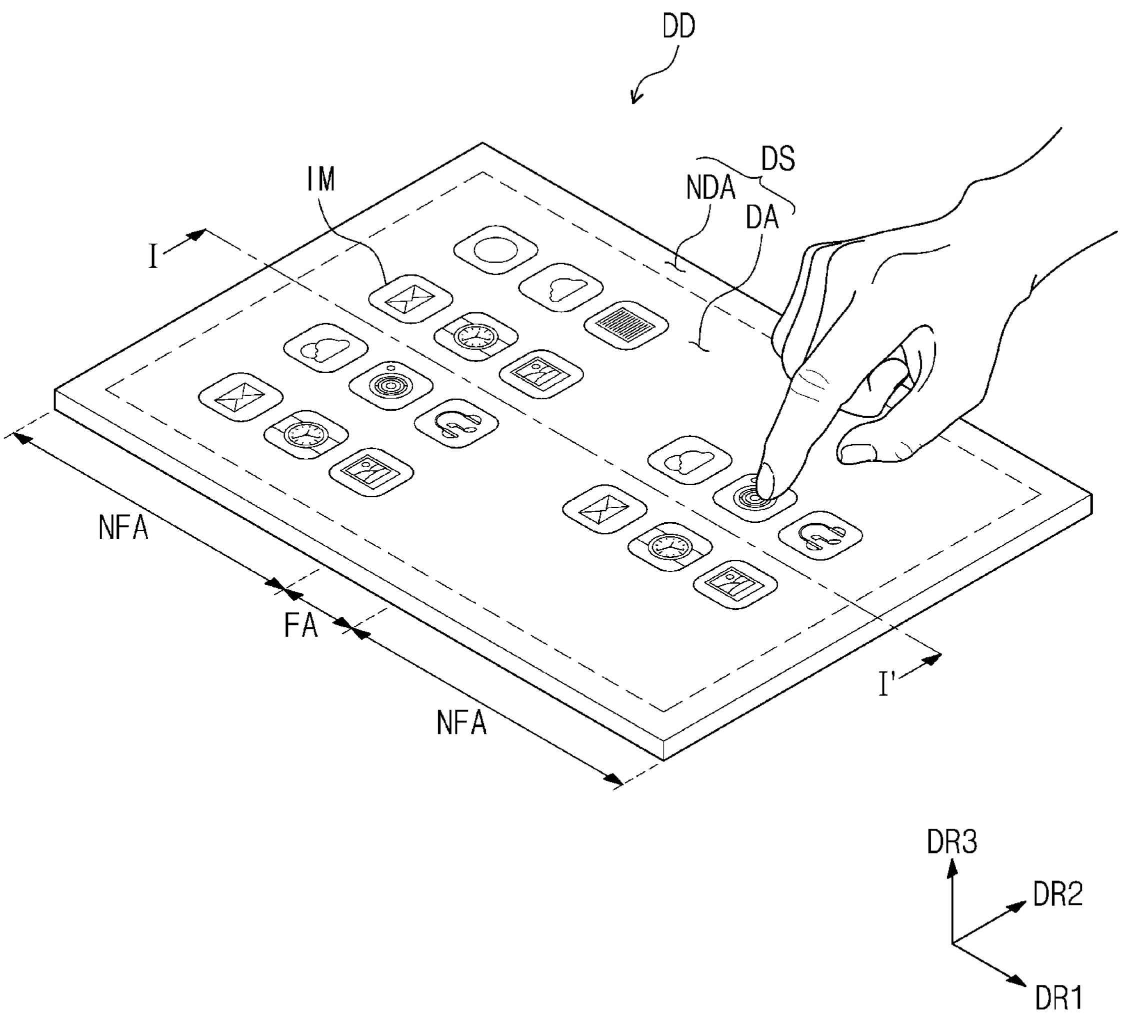
FIG. 1 is a perspective view of a display device according to an embodiment of the present disclosure.

In the present specification, when an element (or a region, a layer, a portion, etc.) is referred to as being "on," "connected to," or "coupled to" another element, the element may be directly disposed on/connected to/coupled to the other element, or a third element may be disposed therebetween.

Like reference numerals may refer to like elements throughout the specification. In addition, in the drawings, the thickness, the ratio, and the dimensions of elements may be exaggerated for an effective description of the technical content. The term "and/or," includes all combinations of one or more of the associated listed items.

It will be understood that, although the terms "first", "second", etc. may be used herein to describe various elements, these elements should not be limited by these terms. These terms are used to distinguish one element from another. For example, a first element could be termed a second element, and, similarly, a second element could be termed a first element. The terms of a singular form may include plural forms unless the context clearly indicates otherwise.

In addition, terms such as "below", "lower", "Above", and "upper" are used to describe the relationship between elements shown in the drawings. The terms are relative concepts and are described based on the directions indicated in the drawings.

It should be understood that the terms "comprise", or "have" are intended to specify the presence of stated features, integers, processes, operations, elements, components, or combinations thereof in the disclosure, but do not preclude the presence or addition of one or more other features, integers, processes, operations, elements, components, or combinations thereof.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and should not be interpreted in an ideal or overly formal sense unless expressly so defined herein.

Hereinafter, a display device according to an embodiment of the present disclosure will be described with reference to the accompanying drawings.

Figure 2:
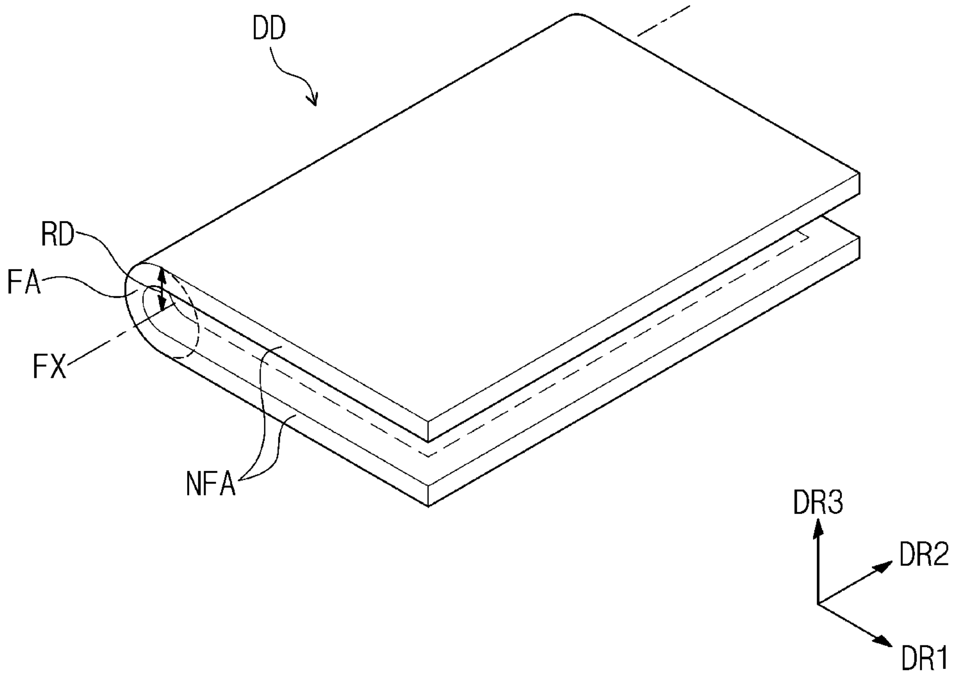
FIG. 2 is a diagram illustrating a folded state of the display device illustrated in FIG. 1.

FIG. 1 is a perspective view of a display device according to an embodiment of the present disclosure. FIG. 2 is a diagram illustrating a folded state of the display device illustrated in FIG. 1.

Referring to FIG. 1, a display device DD of an embodiment of the present disclosure may have a rectangular shape having long sides extending in a direction of a first directional axis DR1 and short sides extending in a direction of a second directional axis DR2 crossing the first directional axis DR1. However, an embodiment of the present disclosure is not limited thereto, and the display device DD may have various shapes such as a circular shape and a polygonal shape on a plane. In addition, the display device DD may have curved or rounded edges. The display device DD may be a flexible display device.

In the display device DD according to an embodiment of the present disclosure, a display surface DS on which an image IM is displayed may be parallel to a plane formed by the first directional axis DR1 and the second directional axis DR2. A third directional axis DR3 indicates the normal direction of the display surface DS, in other words, the thickness direction of the display device DD. The front surface (or upper surface) and the rear surface (or lower surface) of each member may be defined by the third directional axis DR3. However, the directions indicated by the first to third directional axes DR1, DR2, and DR3 are relative concepts and may thus be changed to other directions. Hereinafter, the first to third directions are respectively indicated by the first to third directional axes DR1, DR2, and DR3, and are thus denoted by the same reference numerals.

The display device DD of an embodiment of the present disclosure may include a folding region FA, and a non-folding region NFA. Referring to FIGS. 1 and 2, the display device DD may include the folding region FA and a plurality of non-folding regions NFA. The folding region FA may be disposed between the non-folding regions NFA, and the folding region FA and the non-folding regions NFA may be disposed adjacent to each other in the direction of the first directional axis DR).

The folding region FA may be a part of the display device DD that is deformable into a shape when folded with respect to a folding axis FX extending in the direction of the second directional axis DR2. The radius of curvature RD of the folding region FA may be about 1 mm to about 1.5 mm. The folding region FA may also be a part of the display device DD that can be bent with respect to a folding axis extending in the direction of the first directional axis DR1. In this case, the folding axis may correspond to line I-I' in FIG. 1.

FIGS. 1 and 2 illustrate one folding region FA and two non-folding regions NFA, but number of folding regions FA and number of non-folding regions NFA are not limited thereto. For example, the display device DD may include more than two non-folding regions NFA and a plurality of folding regions FA disposed between the non-folding regions NFA.

In the display device DD of an embodiment of the present disclosure, the non-folding regions NFA may be disposed to be symmetrical to each other with respect to the folding region FA. However, an embodiment of the present disclosure is not limited thereto. The non-folding regions NFA facing each other with respect to the folding region FA may have areas different from each other.

The display surface DS of the display device DD may include a display region DA and a non-display region NDA around the display region DA. The display region DA may display the image IM, and the non-display region NDA may not display the image IM. The non-display region NDA may surround the display region DA and may define the border of the display device DD. In the alternative, the non-display region NDA may be disposed on less than all sides of the display device DD.

Referring to FIG. 2, the display device DD may be a bendable (e.g., flexible) display device DD that is folded or unfolded. For example, the folding region FA is bent with respect to the folding axis FX parallel to the second directional axis DR2, so that the display device DD may be folded. The folding axis FX may be a short axis parallel to the short side of the display device DD. However, the folding axis FX may be a long axis parallel to the long side of the display device DD.

When the display device DD is folded, the non-folding regions NFA may face each other. In other words, the non-folding regions NFA may overlap each other. The display device DD may be in-folded so that the display surface DS is not exposed to the outside. However, an embodiment of the present disclosure is not limited thereto. For example, the display device DD may be out-folded so that the display surface DS is exposed to the outside.

Figure 3:
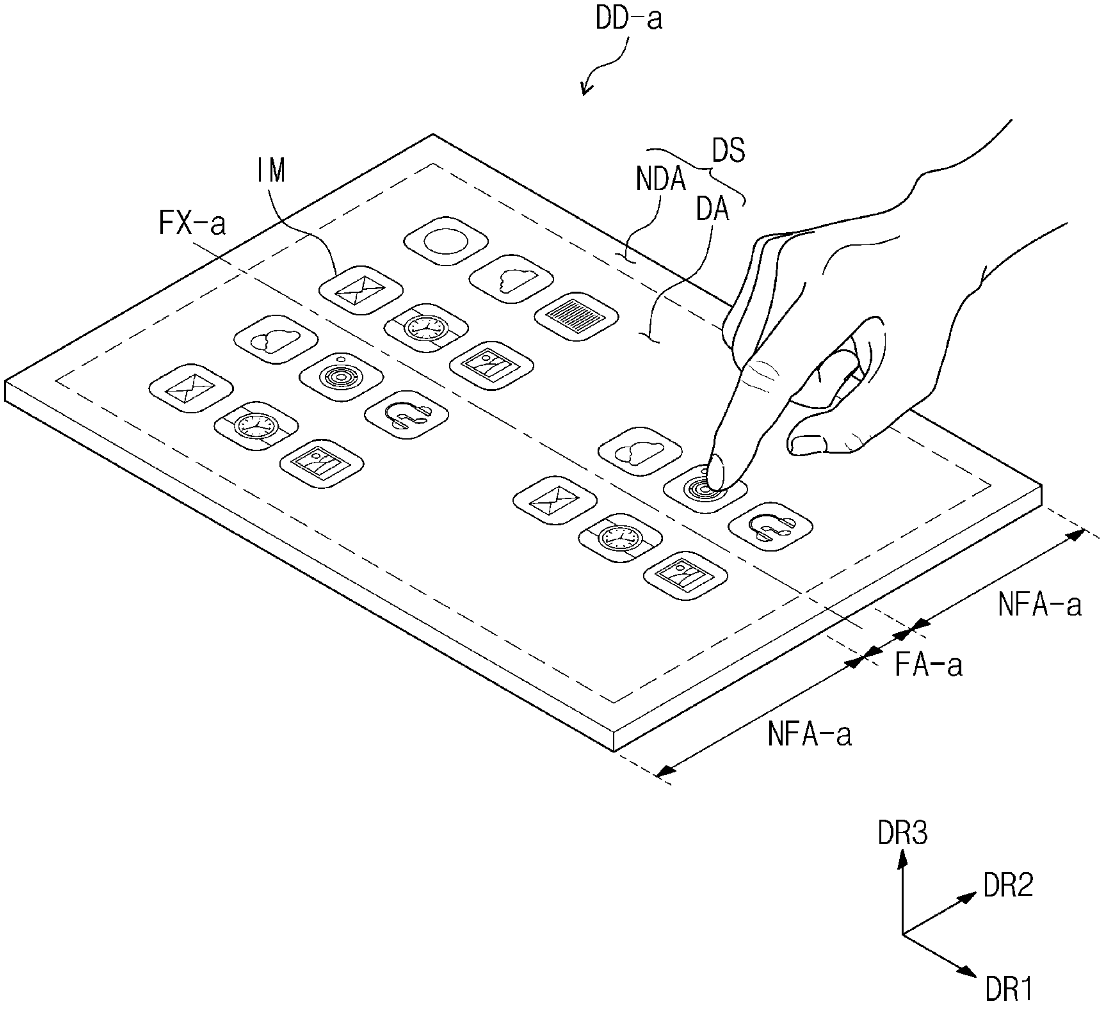
FIG. 3 is a perspective view of a display device according to an embodiment of the present disclosure.
Figure 4:
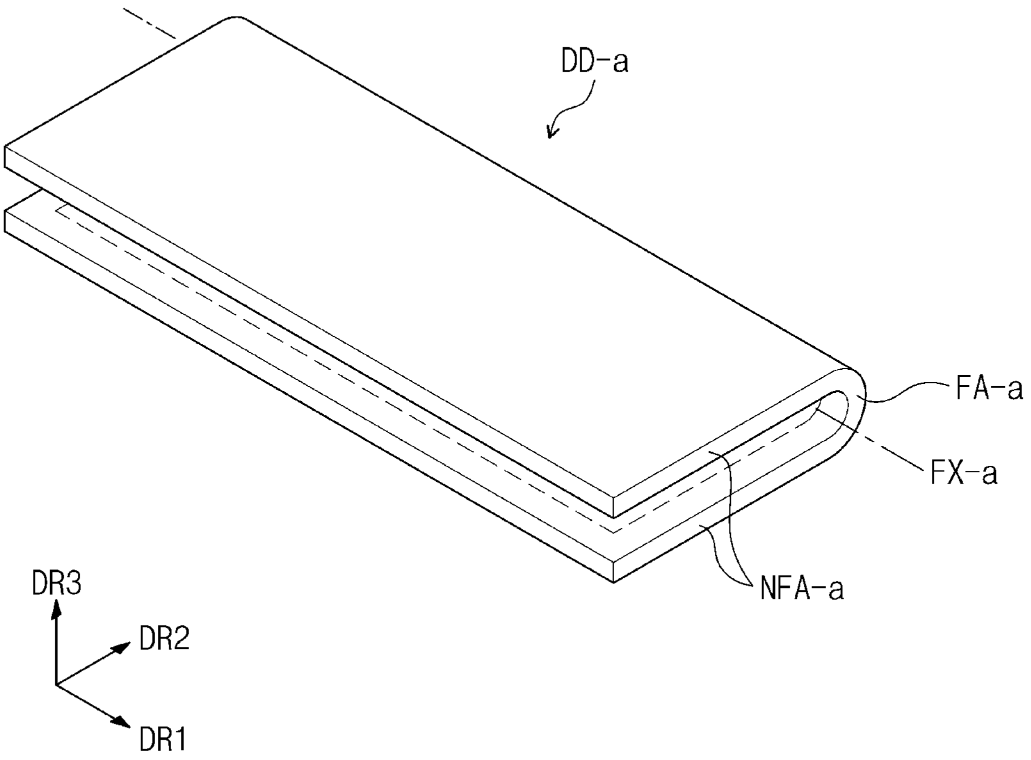
FIG. 4 is a diagram illustrating a folded state of the display device illustrated in FIG. 3.

FIG. 3 is a perspective view of a display device according to an embodiment of the present disclosure. FIG. 4 is a diagram illustrating a folded state of the display device illustrated in FIG. 3.

Except for a folding operation, a display device DD-a illustrated in FIGS. 3 and 4 may have substantially the same configuration as the display device DD illustrated in FIGS. 1 and 2. Accordingly, the following description of the display device DD-a illustrated in FIGS. 3 and 4 will be focused on the folding operation.

Referring to FIGS. 3 and 4, the display device DD-a may include a folding region FA-a and a plurality of non-folding regions NFA-a. The folding region FA-a may be disposed between the non-folding regions NFA-a, and the folding region FA-a and the non-folding regions NFA-a may be disposed adjacent to each other in the direction of the second directional axis DR2.

The folding region FA-a is bent with respect to the folding axis FX-a parallel to the first directional axis DR1, so that the display device DD-a may be folded. The folding axis FX-a may be a long axis parallel to the long side of the display device DD-a. The display device DD illustrated in FIG. 1 may be folded with respect to the short axis, but, on the contrary, the display device DD-a illustrated in FIG. 3 may be folded with respect to the long axis. FIG. 4 illustrates that the display device DD-a is in-folded so that the display surface DS is not exposed to the outside. However, the display device DD-a may be folded with respect to the long axis and out-folded.

Hereinafter, a display device of an embodiment of the present disclosure will be described with reference to the case where the display device DD folded with respect to the short axis, but the present disclosure is not limited thereto. Thus, the following description may also be applied to the display device DD-a folded with respect to the long axis.

Figure 5:
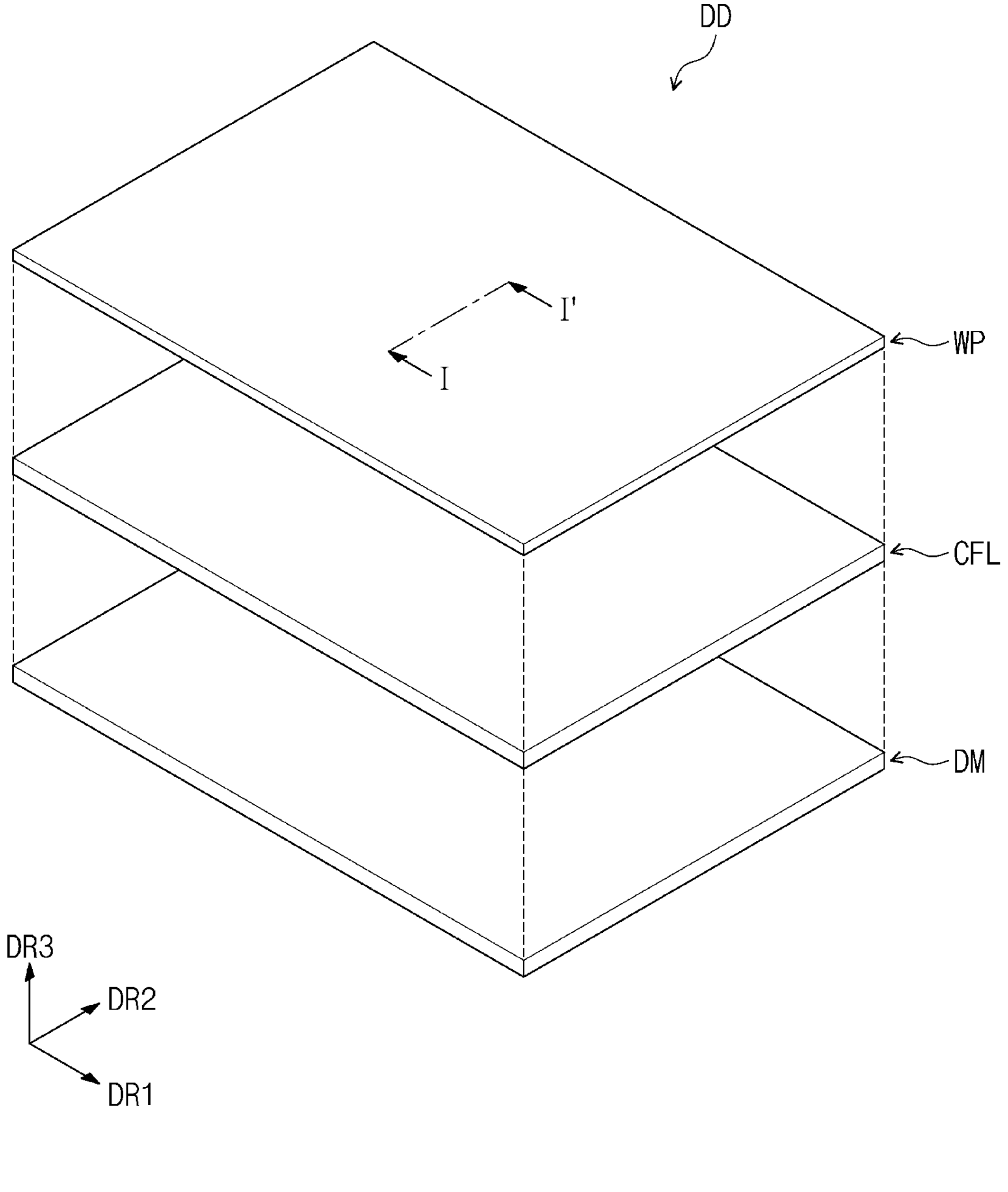
FIG. 5 is an exploded perspective view illustrating a display device according to an embodiment of the present disclosure.
Figure 6:
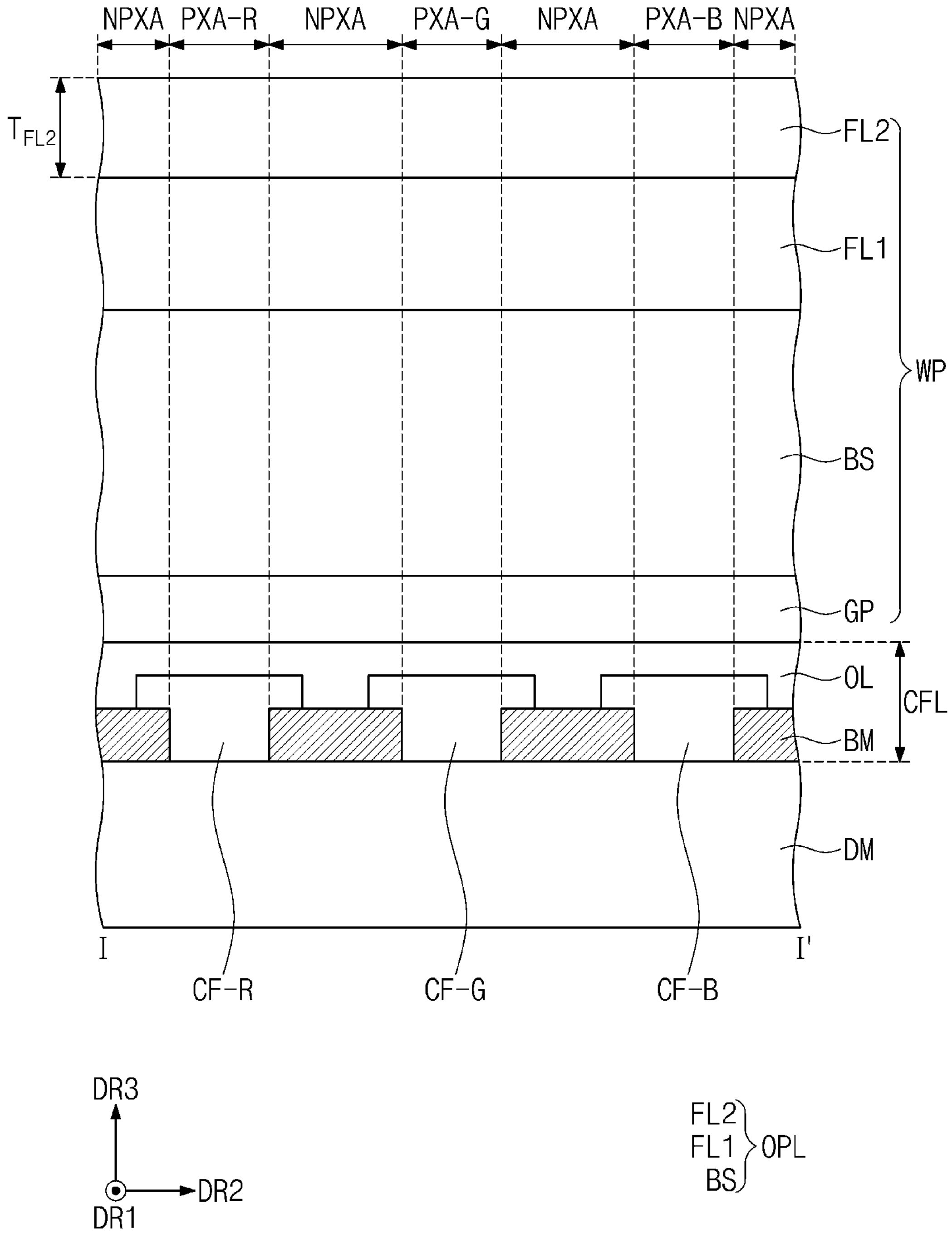
FIG. 6 is a cross-sectional view of a display device according to an embodiment of the present disclosure.

FIG. 5 is an exploded perspective view of a display device of an embodiment of the present disclosure. FIG. 6 is a cross-sectional view of a display device according to an embodiment of the present disclosure. FIG. 6 is a cross-sectional view of a portion taken along line I-I' of FIG. 5.

Referring to FIGS. 5 and 6, the display device DD of an embodiment of the present disclosure may include a display module DM, a color filter layer CFL, and a window panel WP. The display device DD may have a structure in which the display module DM, the color filter layer CFL, and the window panel WP are sequentially stacked. In this case, the color filter layer CFL may be disposed between the display module DM and the window panel WP, and the window panel WP may overlap the color filter layer CFL and the display module DM.

In an embodiment of the present disclosure, the display device DD may include a non-light-emitting region NPXA and light-emitting regions PXA-R, PXA-G, and PXA-B. The light-emitting regions PXA-R, PXA-G, and PXA-B each may be a region from which light generated from each of a plurality of different light-emitting elements is emitted. In the display device DD illustrated in FIG. 6, three light-emitting regions PXA-R, PXA-G, and PXA-B respectively emitting red light, green light, and blue light are illustrated. For example, the display device DD may include a red light-emitting region PXA-R, a green light-emitting region PXA-G, and a blue light emitting region PXA-B, which are distinguished from each other. Other light emitting regions which emits such as cyan light-emitting regions and magenta light-emitting regions may be implemented in the display device DD.

In an embodiment of the present disclosure, the display module DM may include a display panel including light emitting elements that emit light toward the color filter layer CFL. For example, the display panel may be an organic electroluminescence display panel or a quantum dot light emitting display panel.

In an embodiment of the present disclosure, the display module DM may emit light of different wavelength ranges in portions respectively corresponding to the light-emitting regions PXA-R, PXA-G, and PXA-B. For example, the display module DM emits red light in a portion corresponding to the red light-emitting regions PXA-R, emits green light in a portion corresponding to the green light-emitting region PXA-G, and emits blue light in a portion corresponding to the blue light-emitting region PXA-B.

However, this is merely an example, and the present disclosure is not limited thereto. The display module DM may emit light of the same wavelength range in portions corresponding to light emitting regions PXA-R, PXA-G, and PXA-B, or at least one of the portions may emit light of a different wavelength range.

In an embodiment of the present disclosure, the color filter layer CFL may be disposed on the display module DM. For example, the color filter layer CFL may be directly disposed on the display module DM. Although FIG. 6 illustrates that filter parts CF-R, CF-G, and CF-B of the color filter layer CFL are provided directly on the display module DM, the present disclosure is not limited thereto. For example, the filter parts CF-R, CF-G, and CF-B of the color filter layer CFL may be provided on the lower surface of a glass substrate GP.

The color filter layer CFL may include a light-shielding part BM, filter parts CF-R, CF-G, and CF-B, and an organic layer OL. The color filter layer CFL may include a first filter part CF-R that transmits red light, a second filter part CF-G that transmits green light, and a third filter part CF-B that transmits blue light. In other words, the first filter part CF-R may be a red filter, the second filter pan CF-G may be a green filter, and the third filter part CF-B may be a blue filter. The first to third filter parts CF-R, CF G, and CF-B may be disposed to respectively correspond to the red light-emitting region PXA-R, the green light-emitting region PXA-G, and the blue light-emitting region PXA-B.

The first to third filter parts CF-R, CF-G, and CF-B each may include a polymer photosensitive resin, and a pigment or a dye. The first filter pan CF-R may include a red pigment or dye, the second filter pan CF-G may include a green pigment or dye, and the third filter part CF-B may include a blue pigment or dye. However, an embodiment of the present disclosure is not limited thereto, and the third filter pan CF-B may not include a pigment or a dye. The third filter part CF-B may include a polymer photosensitive resin, but not include a pigment or a dye. The third filter part CF-B may be transparent. The third filter part CF-B may be formed of a transparent photosensitive resin.

The light-shielding pan BM may be a black matrix. The light-shielding part BM may be disposed directly on the display module DM and portions of the first to third filter pans CF-R, CF-G and CF-B may overlap the light-shielding part BM. The light-shielding part BM may include an organic or inorganic light-shielding material that contains a black pigment or a black dye. The light-shielding part BM may prevent light leakage and demarcate boundaries between the adjacent first to third filter parts CF-R, CF-G, and CF-B. In addition, in an embodiment of the present disclosure, the light-shielding part BM may be formed of a blue filter.

The window panel WP may be disposed on the color filter layer CFL. The window panel WP may include the glass substrate GP, and an optical layer OPL. The glass substrate GP may be disposed more adjacent to the color filter layer CFL than the optical layer OPL. In other words, the glass substrate GP may be provided between the color filter layer CFL and the optical layer OPL. For example, the glass substrate GP may be a member that provides a base surface on which the color filter layer CFL, etc. are disposed.

The optical layer OPL may be disposed on the glass substrate GP. The optical layer OPL may include a base layer BS, a first functional layer FL1, and a second functional layer FL2. The base layer BS, the first functional layer FL1 and the second functional layer FL2 may be arranged in sequence. The optical layer OPL may have a reflectance of about 1.08% to about 5.00%. The optical layer OPL may not have a reflectance of less than about 1.08% due to the material properties of the first functional layer FL1, the second functional layer FL2, and the base layer BS. In addition, when the optical layer OPL has a reflectance of greater than about 5.00%, the optical layer OPL may not function as a low reflection layer. In the present specification, the reflectance is referred to as the ratio of light reflected to the outside to light incident from the outside in a direction of the display module DM. The light reflected to the outside includes both specularly reflected light that is reflected at the same angle as the incident angle, and diffused reflected light that is scattered and reflected in various directions. In other words, in the present specification, the reflectance is referred to as specular component included (SCI) reflectance.

The base layer BS may be disposed on the glass substrate GP. Although FIG. 6 illustrates that the base layer BS is directly disposed on the glass substrate GP, an embodiment of the present disclosure is not limited thereto. For example, an adhesive layer may be disposed on the glass substrate GP, and the base layer BS may be disposed on the adhesive layer.

The base layer BS may be disposed more adjacent to the glass substrate GP than the first functional layer FL1 and the second functional layer FL2. The base layer BS may be disposed between the glass substrate GP and the first functional layer FL1. The base layer BS may be thicker than the first functional layer FL1. The base layer BS may be a member that provides a base surface on which the first functional layer FL1 is disposed. The base layer BS may include at least one of a polyimide, a polyethylene terephthalate, or a polycarbonate.

The modulus of the base layer BS may be about 3 GPa to about 5 Gpa. When the modulus of the base layer BS is less than about 3 GPa, the shape of the base layer BS may not be maintained, and when the modulus of the base layer BS is greater than about 5 GPa, damage to the base layer BS may occur during a folding operation of the display device DD.

The first functional layer FL1 may be disposed on the base layer BS. For example, the first functional layer FL1 may be in direct contact with the base layer BS. The first functional layer FL1 may be disposed more adjacent to the base layer BS than the second functional layer FL2. In other words, the first functional layer FL1 may be disposed between the base layer BS and the second functional layer FL2. The first functional layer FL1 may include a hard coating agent and an anti-static agent. In other words, the first functional layer FL1 may function as a hard coating layer and an anti-static layer at the same time.

The second functional layer FL2 may be disposed on the first functional layer FL1. The first functional layer FL1 may be thicker than the second functional layer FL2. The second functional layer FL2 may be disposed on the uppermost portion of the optical layer OPL. In other words, the second functional layer FL2 may form an upper surface of the optical layer OPL. The second functional layer FL2 may include an anti-fouling agent, and thus may have anti-fouling properties for protecting components, which are disposed under the second functional layer FL2, from external contaminants and moisture. For example, the second functional layer FL2 may have a contact angle of deionized water of about 95 degrees or more. The second functional layer FL2 may include a fluorine-containing silane compound as an anti-fouling agent. For example, the fluorine-containing silane compound may include perfluoro silane, PFPE-silane, pentafluorophenyl triethoxysilane (PFPTES), [1H,1H,2H,2H]-perfluorooctyldimethylchlorosilane (PFOTCS), [1H, 1H, 2H, 2H]-perfluorodecyltriethoxysilane (PFDTES), or [1H,1H,2H,2H]-perfluorooctyldimethylchlorosilane (PFODCS). In an embodiment of the present disclosure, the second functional layer FL2 may further include an amino silane compound as an anti-fouling agent. For example, the amino silane compound may be aminopropyltrimethoxysilane (APTMS), N-(2-aminoethyl)-3-aminopropyltrimethoxysilane (AEAPTMS), or N-(2-aminoethyl)-11-aminoundecyltrimethoxysilane (AUTMS) (3-trimethoxysilylpropyl) diethylenetriamine (DETA). The second functional layer FL2 further including an amino silane compound as an anti-fouling agent may have high wear resistance properties and chemical resistance properties.

In an embodiment of the present disclosure, the second functional layer FL2 may be a single layer having a refractive index of about 1.3 to about 1.5. In other words, the second functional layer FL2 may have a refractive index of about 1.3 to about 1.5, and may be a single layer including an anti-fouling agent. The refractive index of the second functional layer FL2 may be greater less than the refractive index of the first functional layer FL1. Since the second functional layer FL2, which is a single layer, has a refractive index of about 1.3 to about 1.5, the second functional layer FL2 is slightly different in refractive index from the refractive index of air being about 1.0, and may thus have a low reflectance. As a result, in an embodiment of the present disclosure, the optical layer OPL including the second functional layer FL2 may have a reflectance of about 1.08% to about 5.00%.

The second functional layer FL2, which is a single layer, may have a thickness $T_{FL2}$ of about 30 nm to about 120 nm. When the second functional layer FL2, which is a single layer, has a thickness $T_{FL2}$ of less than about 30 nm, the second functional layer FL2 may reflect the light of a specific wavelength, thereby causing a color to be exhibited. When the second functional layer FL2, which is a single layer, has a thickness $T_{FL2}$ of greater than about 120 nm, the efficiency for the process for stacking the second functional layer FL2 may decrease.

An embodiment of the present disclosure may provide a display device DD including: a display module DM; a color filter layer CFL disposed on the display module DM; and a window panel WP disposed on the color filter layer CFL, wherein the window panel WP includes a glass substrate GP adjacent to the color filter layer CFL, and an optical layer OPL disposed on the glass substrate GP and having a reflectance of about 1.08% to about 5.00%, wherein the optical layer OPL includes: a base layer BS adjacent to the glass substrate GP, a first functional layer FL1 disposed on the base layer BS, wherein the first functional layer FL1 includes a hard coating agent and an anti-static agent, and a second functional layer FL2 disposed on the first functional layer FL1, wherein the second functional layer FL2 includes a fluorine-containing silane compound.

Figure 7:
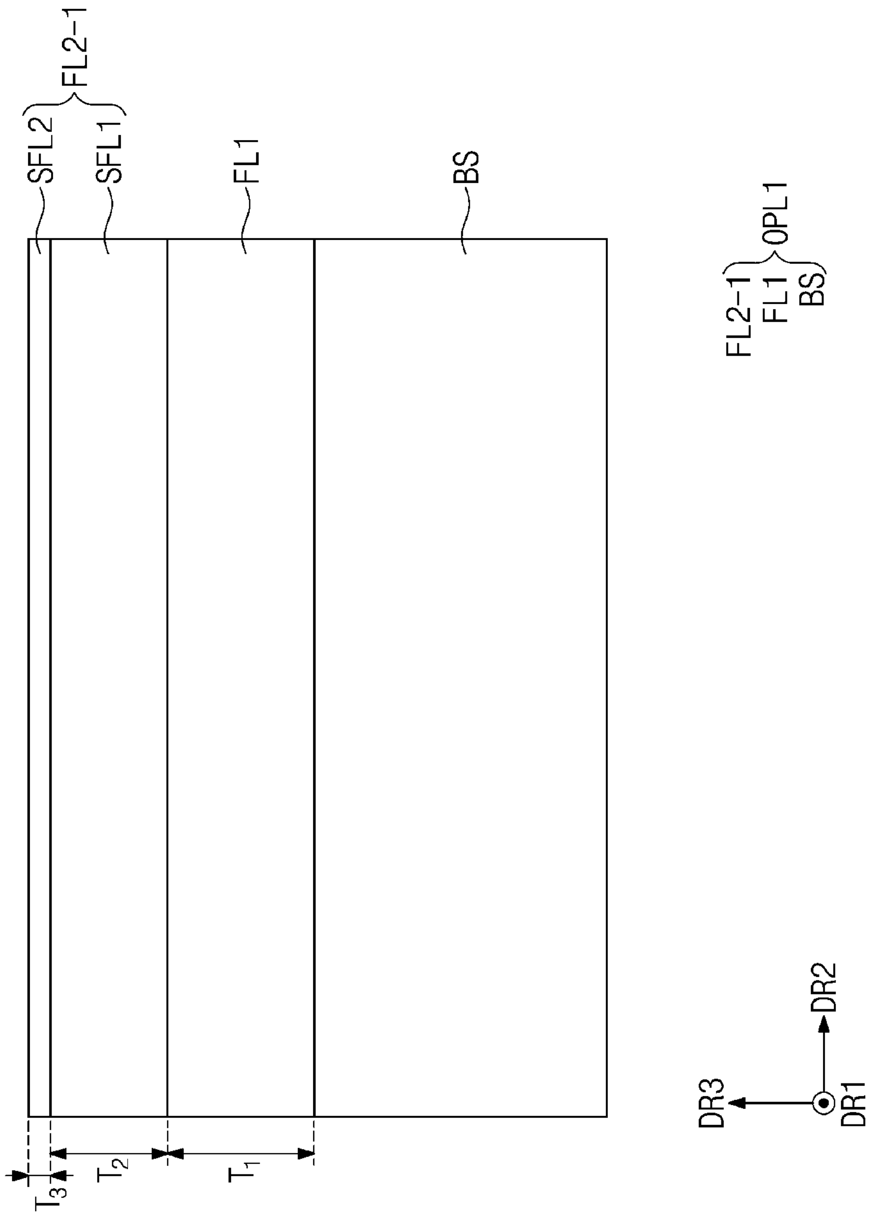
FIG. 7 is a cross-sectional view of an optical layer according to an embodiment of the present disclosure.

FIG. 7 illustrates an optical layer OPL1 according to an embodiment of the present disclosure. Hereinafter, the same content which has been described in FIGS. 1 to 6 may not be described again, and description will mainly be focused on differences.

Unlike the optical layer OPL (FIG. 6) illustrated in FIG. 6, the optical layer OPL1 illustrated in FIG. 7 has a second functional layer FL2-1 which is not a single layer, but includes a first sub-functional layer SFL1, and a second sub-functional layer SFL2 disposed on the first sub-functional layer SFL1.

Referring to FIG. 7, in an embodiment of the present disclosure, the optical layer OPL1 may include the second functional layer FL2-1 including the first sub-functional layer SFL1 and the second-sub functional layer SFL2. The first sub-functional layer SFL1 may be disposed on the first functional layer FL1. For example, the first sub-functional layer SFL1 may be in direct contact with the first functional layer FL1. The second sub-functional layer SFL2 may be disposed on the first sub-functional layer SFL1. The second sub-functional layer SFL2 may be disposed on the uppermost part of the optical layer OPL1.

The first sub-functional layer SFL1 may function to refract external light, and the second sub-functional layer SFL2 may have an anti-fouling function. For example, the first sub-functional layer SFL1 may include a silicon oxide. For example, the first sub-functional layer SFL1 may not include a fluorine-containing silane compound as an anti-fouling agent, and the second sub-functional layer SFL2 may include a fluorine-containing silane compound as an anti-fouling agent.

The second sub-functional layer SFL2 may be disposed on the uppermost portion of the optical layer OPL1 to perform an anti-fouling function. For example, the second sub-functional layer SFL2 may protect the first sub-functional layer SFL1 and the first functional layer FL1, which are disposed under the second sub-functional layer SFL2, from fingerprints, moisture, or other contaminants caused by a user's use.

The first sub-functional layer SFL1 may have a refractive index of about 1.3 to about 1.5. When the refractive index is about 1.5 or more, the reflectance of the optical layer OPL1 is greater than about 5.00%, and thus the low reflection function may not be performed. Since the first sub-functional layer SFL1 has a refractive index of about 1.3 to about 1.5, the first sub-functional layer SFL1 is slightly different in refractive index from the refractive index of air being about 1.0, thereby exhibiting a low reflectance. As a result, in an embodiment of the present disclosure, the optical layer OPL1 including the first sub-functional layer SFL1 may have a reflectance of about 1.08% to about 5.00%.

The first sub-functional layer SFL1 may have a thickness $T_2$ of about 30 nm to about 120 nm, and the second sub-functional layer SFL2 may have a thickness $T_3$ of about 1 nm to about 25 nm. When the first sub-functional layer SFL1 has a thickness $T_2$ of less than 30 nm, there is an issue of indicating color by reflecting the light of a specific wavelength. When the first sub-functional layer SFL1 has a thickness $T_2$ of greater than about 120 nm, there is an issue in that the efficiency for the process decreases. The second sub-functional layer SFL2 having a thickness $T_3$ of less than 1 nm make limit the anti-fouling function, and the second sub-functional layer SFL2 having a thickness $T_3$ of greater than about 25 nm may cause errors in processing.

In FIG. 7, the thickness $T_2$ of the first sub-functional layer SFL1 may be less than or equal to a thickness $T_1$ of the first functional layer FL1. In addition, the combined thicknesses $T_2$ and $T_3$ of the first and second sub-functional layers SFL1 and SFL2 may be greater than or equal to the thickness $T_1$ of the first functional layer FL1. Furthermore, the combined thicknesses $T_2$ and $T_3$ of the first and second sub-functional layers SFL1 and SFL2 may be less than the thickness $T_1$ of the first functional layer FL1.

Figure 8:
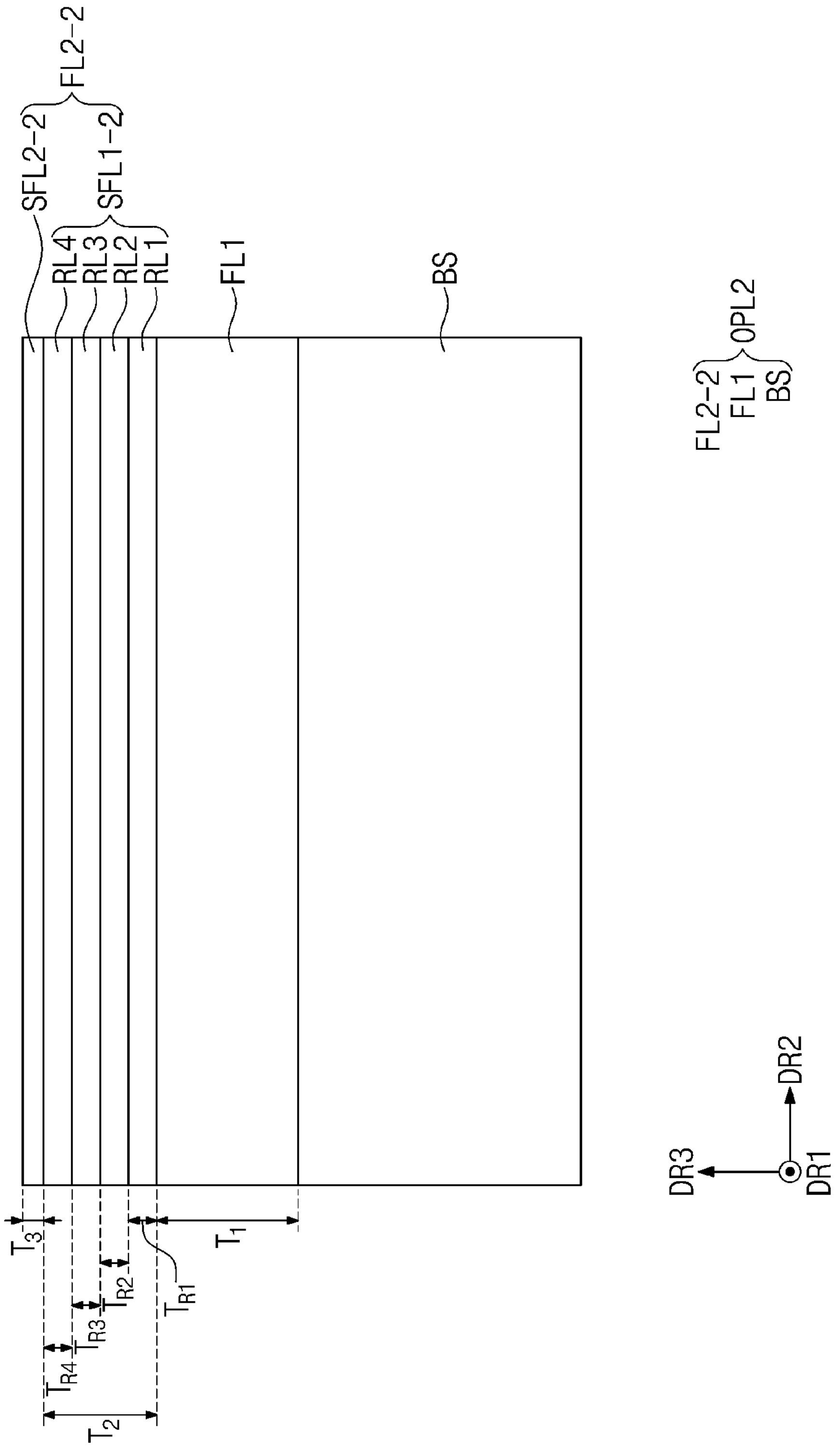
FIG. 8 is a cross-sectional view of an optical layer according to an embodiment of the present disclosure.

FIG. 8 illustrates an optical layer OPL2 according to an embodiment of the present disclosure. Hereinafter, the same contents which have been described in FIGS. 1 to 6 may not be described again, and description will mainly be focused on differences.

The optical layer OPL2 illustrated in FIG. 8 according to an embodiment of the present disclosure differs from the optical layer OPL illustrated in FIG. 6 in that in the optical layer OPL2, a first sub-functional layer SFL1-2 included in the second functional layer FL2-2 has a structure in which a plurality of refractive layers are stacked.

Referring to FIG. 8, the optical layer OPL2 according to an embodiment of the present disclosure may include a first sub-functional layer SFL1-2 having a structure in which a plurality of refractive layers RL1, RL2, RL3, and RL4 are stacked, and a second sub-functional layer SFL2-2 disposed on the first sub-functional layer SFL1-2. FIG. 8 illustrates that the first sub-functional layer SFL1-2 includes four refractive layers RL1, RL2, RL3, and RL4, but this is merely an example, and an embodiment of the present disclosure is not limited thereto. For example, the first sub-functional layer SFL1-2 may include two refractive layers, three refractive layers, or five or more refractive layers.

In the first sub-functional layer SFL1-2, a first refractive index of the first refractive layer RL1 which is most adjacent to the first functional layer FL1 may be higher than a second refractive index of a second refractive layer RL2 disposed directly on the first refractive layer RL1. A second refractive index of the second refractive layer RL2 may be lower than a third refractive index of a third refractive layer RL3 directly disposed on the second refractive layer RL2. A third refractive index of the third refractive layer RL3 may be higher than a fourth refractive index of a fourth refractive layer RL4 disposed directly on the third refractive layer RL3. In other words, the first sub-functional layer SFL1-2 may include at least one high-refractive layer and at least one low-refractive layer, which are alternately disposed.

The fourth refractive layer RL4 may transmit a portion of light incident from the outside toward the display module DM (of FIG. 6), and reflect another portion of the light on the surface of the fourth refractive layer RL4. A portion of the light passing through the fourth refractive layer RL4 may be reflected by the third refractive layer RL3, and another portion of the light may pass through the third refractive layer RL3. A portion of the light passing through the third refractive layer RL3 may pass through the second refractive layer RL2, and another portion of the light may be reflected at the interface between the second refractive layer RL2 and the third refractive layer RL3. The light reflected from the fourth refractive layer RL4 and the light reflected from the interface between the third refractive layer RL3 and the second refractive layer RL2 may cause destructive interference with each other. As a result, the optical layer OPL2 of an embodiment of the present disclosure may have a reflectance of about 1.08% to about 5.00%.

The first refractive layer RL1 and the third refractive layer RL3 may each include a niobium oxide, and the second refractive layer RL2 and the fourth refractive layer RL4 may each include a silicon oxide. The first refractive index and the third refractive index may each be about 2.0 to about 2.5. The second refractive index and the fourth refractive index may each be about 1.3 to about 1.5.

The first refractive layer RL1 may have a thickness $T_{R1}$ of about 10 nm to about 20 nm. The second refractive layer RL2 may have a thickness $T_{R2}$ of about 20 nm to about 40 nm. The third refractive layer RL3 may have a thickness $T_{R3}$ of about 100 nm to about 150 nm. The fourth refractive layer RL4 may have a thickness $T_{R4}$ of about 50 nm to about 150 nm. For example, the thicknesses of the first to third refractive layers RL1 to RL3 may sequentially increase.

Figure 9:
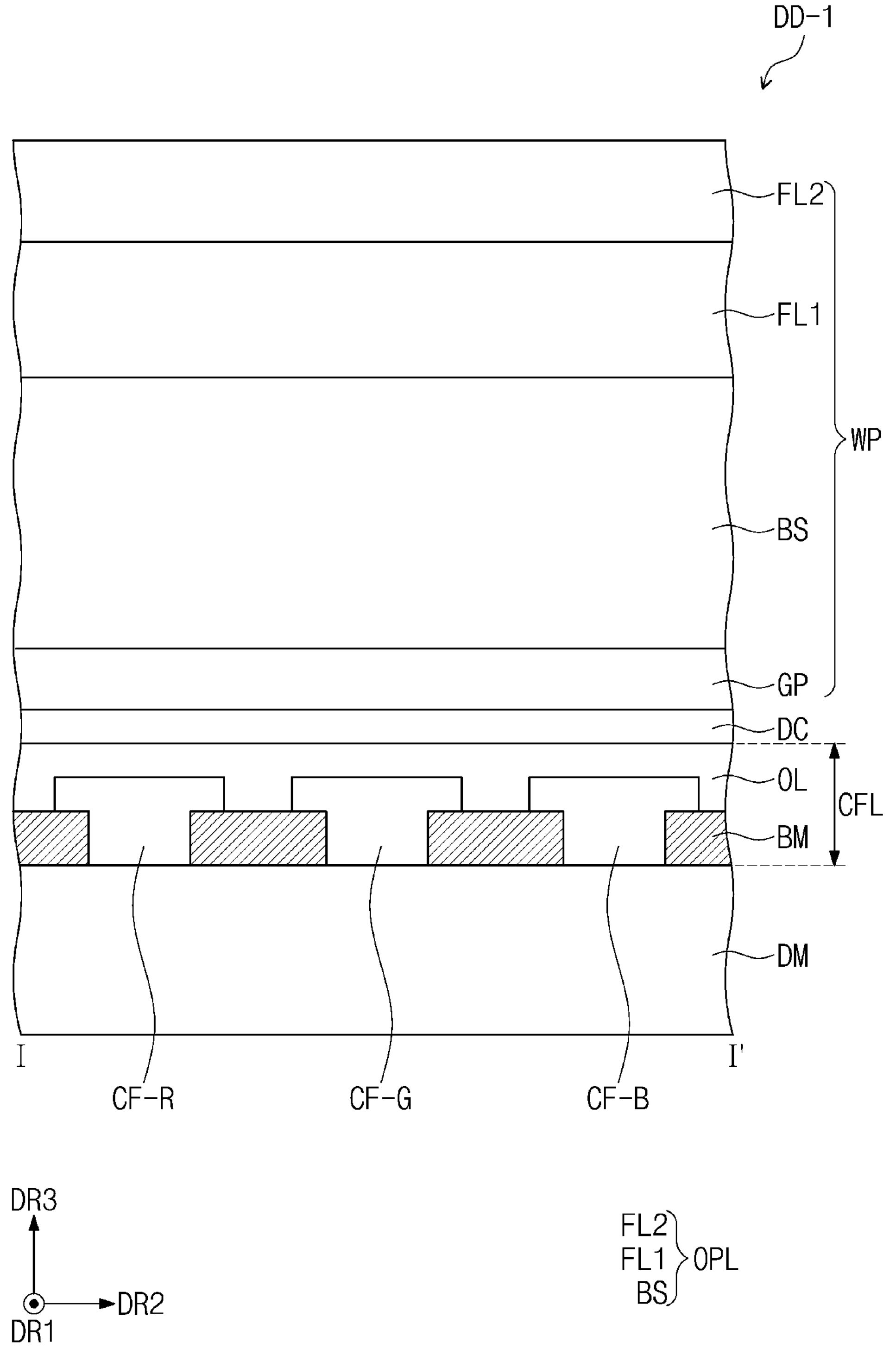
FIG. 9 is a cross-sectional view of a display device according to an embodiment of the present disclosure.

FIG. 9 illustrates a display device DD-1 according to an embodiment of the present disclosure. Hereinafter, the same contents which have been described in FIGS. 1 to 6 may not be described again, and description will mainly be focused on differences.

Unlike the display device DD illustrated in FIG. 6, the display device illustrated in FIG. 9 according to an embodiment of the present disclosure further includes an adhesive impact-absorbing layer DC between the glass substrate GP and the color filter layer CFL. The structures of the optical layers OPL1 and OPL2 (FIGS. 7 and 8) described with reference to FIGS. 7 and 8 may be applied to the display device DD-1 illustrated in FIG. 9.

Referring to FIG. 9, the display device DD-1 may further include the impact-absorbing layer DC between the glass substrate GP and the color filter layer CFL. The impact-absorbing layer DC may be disposed more adjacent to the color filter layer CFL than the glass substrate GP. In other words, the impact-absorbing layer DC is closer to the color filter layer CFL than the glass substrate GP. The impact-absorbing layer DC may include at least one of an indium oxide or a polyethyleneterephthalate. The impact-absorbing layer DC may function to protect the color filter layer CFL disposed under the impact-absorbing layer DC from external impact. The impact-absorbing layer DC may have a thickness of about 1 nm to about 10 nm. When the impact-absorbing layer DC has a thickness of about 1 nm, the impact-absorbing function may not be performed; and when the impact-absorbing layer DC has a thickness of greater than about 10 nm, the flexible properties of the display device DD-1 may be diminished.

The impact-absorbing layer DC may further include a hard coating agent that absorbs ultraviolet rays. The hard coating agent may include an acrylic resin including a dye or a pigment that absorbs ultraviolet rays. The impact-absorbing layer DC may further include a hard coating agent that absorbs ultraviolet rays, thereby reducing the amount of ultraviolet rays entering the display module DM disposed under the impact-absorbing layer DC.

Hereinafter, a display device according to an embodiment of the present disclosure will be described in detail with reference to an Example Embodiment and a Comparative Example. In addition, the Example Embodiment illustrated below is provided to assist in understanding the present disclosure, and the scope of the present disclosure is not limited thereto.

(Production of Display Devices of Comparative Example and Example Embodiment)

Unlike the display device DD illustrated in FIG. 6, a display device according to a Comparative Example includes, on a base layer BS, a functional layer, which is a single layer including all of an anti-fouling agent, a hard coating agent, and an anti-static agent. Unlike the display device of the Comparative Example, the display device DD (FIG. 6) of the Example Embodiment includes, on a base layer BS (FIG. 6), a first functional layer FL1 (FIG. 6) including a hard coating agent and an anti-static agent, and a second functional layer FL2 (FIG. 6) including an anti-fouling agent and having a refractive index of about 1.3 to about 1.5.

(Measurement of Low Reflectance Properties)

Figure 10:
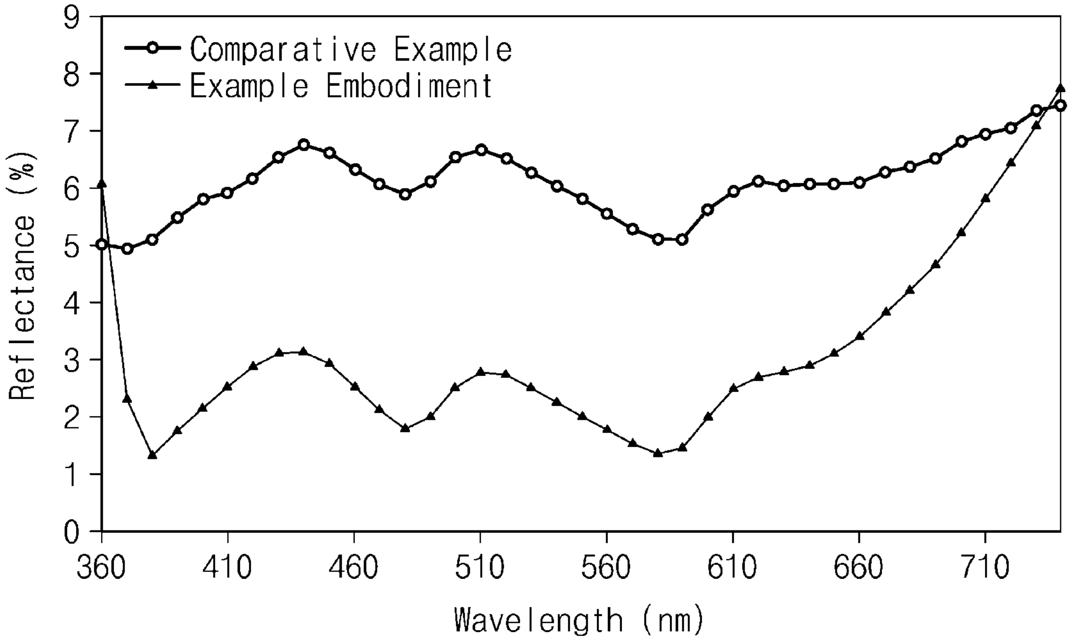
FIG. 10 is a graph illustrating reflectance of display devices according to a comparative example and an embodiment of the present disclosure.

FIG. 10 is a graph showing reflectance of display devices according to the Comparative Example and the Example Embodiment. The graph is obtained by measuring specular component included (SCI) reflectance, which is the ratio of light reflected back to the outside to external light emitted from the outside toward the display device. It may be confirmed that in the visible ray region of about 300 nm to about 700 nm, the reflectance of the display device of the Comparative Example is greater than about 5.00%, and the reflectance of the display device DD (FIG. 6) of the Example Embodiment is about 1.3% to about 5.00%. The results above may demonstrate that the display device DD (FIG. 6) of the present disclosure includes, on the uppermost part thereof, a functional layer including an anti-fouling agent having a refractive index of about 1.3 to about 1.5, and thus has low reflectance properties compared to the display device of the Comparative Example.

(Measurement of Wear Resistance Properties and Chemical Resistance Properties)

Table 1 shows the results obtained by measuring the wear resistance properties and chemical resistance properties of functional layers of display devices according to the Comparative Example and the Example Embodiment. In other words, in the display device of the Comparative Example, the wear resistance properties of a functional layer, which is a single layer including all of an anti-fouling agent, a hard coating agent, and an anti-static agent are measured, and in the display device of the Example Embodiment DD (FIG. 6), the wear resistance properties of a second functional layer FL2 (FIG. 6) including an anti-fouling agent were measured.

The wear resistance properties were evaluated by measuring the contact angle of deionized water to the surface of the functional layer of each of the display devices of the Comparative Example and the Example Embodiment. The maximum number of reciprocations of Minoan Rubber (15 mm in diameter) having a contact angle of deionized water to the surface of the functional layer of about 95 degrees or more was measured, after the Minoan rubber has moved left and right at 50 RPM (Rotation Per Minute) in a reciprocating manner, with a load of 1 kg. As the wear of the surface of a member is developed, the contact angle of the deionized water decreases. Thus, by measuring the maximum number of reciprocations at which the contact angle of deionized water on the surface of the member does not decrease, the wear resistance properties may be evaluated. In the present disclosure, when the maximum number of reciprocations of Minoan Rubber was less than 5000 times, the wear resistance properties were evaluated as poor, and when the maximum number of reciprocations was 5000 times or more, the wear resistance properties were evaluated as excellent.

The chemical resistance properties were evaluated by measuring the contact angle of deionized water to the surface of the functional layer in a state in which ethanol (purity of 99.99%) was applied to the surface of the functional layer of the display devices of the Comparative Example and the Example Embodiment. The maximum number of reciprocations, which satisfies the contact angle of deionized water to the surface of the functional layer of about 95 degrees or more, was measured by using the same technique as in the above-described method for measuring the wear resistance properties, except that, ethanol (purity 99.99%) is applied to the surface of the functional layer. In the present disclosure, when the maximum number of reciprocations of Minoan Rubber was less than 3000 times, the chemical resistance properties were evaluated as poor, and when the maximum number of reciprocations was 3000 times or more, the chemical resistance properties were evaluated as excellent.

TABLE 1

| Division | Comparative Example | Example Embodiment |
|---|---|---|
| Measurement of wear resistance properties | 3000 times | 6000 times |
| Measurement of chemical resistance properties | 1000 times | 3000 times |

Referring to Table 1, in the Comparative Example, the maximum number of reciprocations of Minoan Rubber was 3000 times as the measurement result of the wear resistance properties, and the maximum number of reciprocations of Minoan Rubber was 1000 times as the measurement result of the chemical resistance properties. In the Example Embodiment, however, the maximum number of reciprocations of Minoan Rubber was 6000 times as the measurement result of the wear resistance properties, and the maximum number of reciprocations of Minoan Rubber was 3000 times as the measurement result of the chemical resistance properties. Thus, it may be confirmed that the display device of the Example Embodiment has more excellent wear resistance properties and chemical resistance properties than the display device of the Comparative Example. In other words, the display device of the Comparative Example has the maximum number of reciprocations of Minoan Rubber of less than 5000 times as the measurement result of the wear resistance properties and the maximum number of reciprocations of Minoan Rubber of less than 3000 times as the measurement result of the chemical resistance properties, and thus has poor wear resistance properties and chemical resistance properties. On the other hand, the display device of the Example Embodiment has the maximum number of reciprocations of Minoan Rubber of 5000 times or more as the measurement result of the wear resistance properties, and the maximum number of reciprocations of Minoan Rubber of 3000 times or more as the measurement result of the chemical resistance properties, and thus has excellent wear resistance properties and chemical resistance properties. Through the results above, it may be confirmed that the display device DD (FIG. 6) of the present disclosure separately includes a functional layer containing an anti-fouling agent on the uppermost portion thereof, and thus has more excellent wear resistance properties and chemical resistance properties than the display device of the Comparative Example.

An embodiment of the present disclosure may provide a display device having improved low reflectance properties by including, in a window panel, an optical layer including a functional layer containing a hard coating agent, and a functional layer having low reflectance properties and anti-fouling properties.

A display device according to an embodiment of the present disclosure may include, on a window panel, an optical layer including a functional layer containing a hard coating agent, and a functional layer having low reflectance properties. Thus, the display device may have improved low reflectance properties.

While embodiments of the present disclosure been described, it will be understood by those skilled in the art that variations in form and detail may be made thereto without departing from the spirit and scope of the present disclosure as hereinafter claimed.

What is claimed is:

1. A display device, comprising:

a display module;

a color filter layer disposed on the display module;

a window panel disposed on the color filter layer, wherein the window panel includes a glass substrate adjacent to the color filter layer, and an optical layer disposed on the glass substrate and having a reflectance of about 1.08% to about 5.00% with respect to light having a wavelength range of about 300 nm to about 700 nm; and an impact-absorbing layer disposed between the glass substrate and the color filter layer, wherein the impact-absorbing layer includes an indium oxide, wherein the optical layer includes:

a base layer adjacent to the glass substrate, a first functional layer disposed on the base layer, wherein the first functional layer includes a hard coating agent and an anti-static agent, and a second functional layer disposed on the first functional layer, wherein the second functional layer includes a fluorine-containing silane compound, wherein a thickness of the first functional layer is greater than a thickness of the second functional layer.

2. The display device of claim 1, wherein the second functional layer is a single layer, and the refractive-index of the second functional layer is about 1.3 to about 1.5.

3. The display device of claim 2, wherein the thickness of the second functional layer is about 30 nm to about 120 nm.

4. The display device of claim 1, wherein the second functional layer comprises:

a first sub-functional layer adjacent to the first functional layer, having a refractive index of about 1.3 to about 1.5, and not including the fluorine-containing silane compound; and a second sub-functional layer disposed on the first sub-functional layer, and including the fluorine-containing silane compound.

5. The display device of claim 4, wherein the first sub-functional layer has a thickness of about 30 nm to about 120 nm, and the second sub-functional layer has a thickness of about 1 nm to about 25 nm.

6. The display device of claim 4, wherein the first sub-functional layer comprises a silicon oxide.

7. The display device of claim 1, wherein the second functional layer comprises:

a first sub-functional layer adjacent to the first functional layer, wherein the first sub-functional layer includes at least one high-refractive layer and at least one low-refractive layer, and a second sub-functional layer disposed on the first sub-functional layer, wherein the second sub-functional layer includes the fluorine-containing silane compound.

8. The display device of claim 1, wherein the second functional layer comprises:

a first sub-functional layer; and a second sub-functional layer disposed on the first sub-functional layer, wherein the second sub-functional layer includes the fluorine-containing silane compound, and the first sub-functional layer comprises a first refractive layer, a second refractive layer, a third refractive layer and a fourth refractive layer, which are sequentially stacked in a direction from the first functional layer to the second sub-functional layer, and the first refractive layer and the third refractive layer each have a refractive index of about 2.0 to about 2.5, and the second refractive layer and the fourth refractive layer each have a refractive index of about 1.3 to about 1.5.

9. The display device of claim 8, wherein the first refractive layer and the third refractive layer comprise a niobium oxide, and the second refractive layer and the fourth refractive layer comprise a silicon oxide.

10. The display device of claim 8, wherein the first refractive layer has a thickness of about 10 nm to about 20 nm, the second refractive layer has a thickness of about 20 nm to about 40 nm, the third refractive layer has a thickness of about 100 nm to 150 nm, and the fourth refractive layer has a thickness of about 50 nm to about 150 nm.

11. The display device of claim 1, wherein the impact-absorbing layer has a thickness of about 1 nm to about 10 nm.

12. The display device of claim 1, wherein the base layer comprises a polyimide, a polyethylene terephthalate, or a polycarbonate.

13. The display device of claim 1, wherein the base layer has a modulus of about 3 GPa to about 5 GPa.

14. The display device of claim 1, further comprising a folding region foldable with respect to a folding axis extending in one direction, and a first non-folding region and a second non-folding region which are spaced apart from each other with the folding region disposed therebetween.

15. A display device, comprising:

a display module;

a color filter layer disposed on the display module;

a window panel disposed on the color filter layer, and including an optical layer; and an impact-absorbing layer disposed between the window panel and the color filter layer, wherein the impact-absorbing layer includes an indium oxide, wherein the optical layer includes:

a base layer;

a first functional layer disposed on the base layer, and including a hard coating agent and an anti-static agent; and a second functional layer disposed on the first functional layer, including an anti-fouling agent, and having a refractive index of about 1.3 to about 1.5, wherein a thickness of the first functional layer is greater than a thickness of the second functional layer.

16. The display device of claim 15, wherein the second functional layer is a single layer, and the thickness of the second functional layer is about 30 nm to about 120 nm.

17. The display device of claim 15, wherein the second functional layer comprises:

a first sub-functional layer adjacent to the first functional layer, not including the anti-fouling agent, and having a refractive index of about 1.3 to about 1.5; and a second sub-functional layer disposed on the first sub-functional layer, and including the anti-fouling agent.

18. The display device of claim 15, wherein the second functional layer comprises:

a first sub-functional layer adjacent to the first functional layer; and a second sub-functional layer disposed on the first sub-functional layer, wherein the first sub-functional layer includes:

a first refractive layer having a refractive index of about 2.0 to about 2.5;

a second refractive layer having a refractive index of about 1.3 to about 1.5; and a third refractive layer having a refractive index of about 2.0 to about 2.5.

19. The display device of claim 15, wherein the optical layer has a reflectance of about 1.08% to about 5.00% with respect to light having a wavelength range of about 300 nm to about 700 nm.

20. The display device of claim 15, comprising a plurality of light-emitting regions spaced apart from each other, and a non light-emitting region disposed between the light-emitting regions adjacent to each other, wherein the color filter layer includes:

a plurality of filter parts corresponding to the light-emitting regions;

a light-shielding part disposed between the filter parts, and corresponding to the non light-emitting region; and an organic layer covering the filter parts and the light-shielding part.

21. A display device, comprising:

a display module;

a color filter layer disposed on the display module;

an optical layer disposed on the color filter layer and having a reflectance of about 1.08% to about 5.00% with respect to light having a wavelength range of about 300 nm to about 700 nm; and an impact-absorbing layer disposed between the optical layer and the color filter layer, wherein the impact-absorbing layer includes an indium oxide, wherein the optical layer includes:

a first functional layer including a hard coating agent and an anti-static agent, and a second functional layer disposed on the first functional layer, wherein the second functional layer includes a fluorine-containing silane compound, wherein a thickness of the first functional layer is greater than a thickness of the second functional layer.

22. The display device of claim 21, wherein the second functional layer forms an uppermost portion of the optical layer.

23. The display device of claim 21, wherein the refractive-index of the second functional layer is about 1.3 to about 1.5.

24. The display device of claim 1, wherein the second functional layer covers an entirety of the first functional layer.

* * * * *